United States Patent [19]

Feldstein

[11] 4,419,390

[45] Dec. 6, 1983

[54] METHOD FOR RENDERING NON-PLATABLE SEMICONDUCTOR SUBSTRATES PLATABLE

[76] Inventor: Nathan Feldstein, 63 Hemlock Cir., Princeton, N.J. 08540

[21] Appl. No.: 192,412

[22] Filed: Sep. 29, 1980

Related U.S. Application Data

[60] Division of Ser. No. 931,513, Aug. 7, 1978, Pat. No. 4,228,201, which is a continuation-in-part of Ser. No. 803,777, Jun. 6, 1977, Pat. No. 4,181,760.

[51] Int. Cl.$^3$ .............................................. C23C 3/02
[52] U.S. Cl. ..................................... 427/304; 427/92; 427/305; 427/443.1
[58] Field of Search ............... 427/304, 305, 306, 437, 427/438, 92, 443.1; 106/1.11

[56] References Cited

U.S. PATENT DOCUMENTS

| | | | |
|---|---|---|---|
| 3,096,182 | 7/1963 | Berzins | 427/443.1 |
| 3,666,529 | 5/1972 | Wright et al. | 427/305 |
| 3,671,291 | 6/1972 | Miller et al. | 427/304 X |
| 3,772,056 | 11/1973 | Polichette et al. | 428/320 |
| 3,853,590 | 12/1974 | Kadison et al. | 427/437 |
| 3,870,526 | 3/1975 | Pearlstein et al. | 427/305 X |
| 3,958,048 | 5/1976 | Donovan et al. | 427/304 |
| 3,962,494 | 6/1976 | Nuzzi | 427/304 |
| 3,993,801 | 11/1976 | Feldstein | 427/304 X |
| 4,002,778 | 1/1977 | Bellis et al. | 427/265 X |

FOREIGN PATENT DOCUMENTS 429483 10/1974 U.S.S.R. ................................. 427/92

OTHER PUBLICATIONS

Lowenheim, F. A., *Modern Electroplating*, New York, John Wiley & Sons, Inc., 1974, pp. 630, 720, 727, 728.

*Primary Examiner*—Evan K. Lawrence

[57] ABSTRACT

A process and compositions are described for the reception of electrolytic or electroless plating onto non-platable substrates, in particular, semiconductor substrates. The process comprises immersion of the non-platable substrate in a promoter composition containing primary metal ions, selected from the group consisting of nickel, cobalt, iron, and copper, and mixtures thereof, and a suitable reducing agent. The reducing agent is capable of chemically reacting with the non-platable substrate and the primary metal ions and the concentration of the reducing agent relative to the primary metal ions is so adjusted as to permit the initial chemical interaction of the reducing agent with the non-platable substrate and then the heterogeneous reduction of some of the primary metal ions present in the promoter composition. In addition, the promoter composition also comprises other metal ions selected from the group consisting of tin, cadmium, zinc, thallium, and lead and mixtures thereof, the other metal ions being in a sufficient concentration to inhibit the growth of metallic sites formed at the conclusion of the immersion of the non-platable substrate in the promoter composition.

9 Claims, No Drawings

METHOD FOR RENDERING NON-PLATABLE SEMICONDUCTOR SUBSTRATES PLATABLE

This is a division of application Ser. No. 931,513 filed Aug. 7, 1978, U.S. Pat. No. 4,228,201, which is a continuation-in-part of Ser. No. 803,777, filed June 6, 1977, U.S. Pat. No. 4,181,760.

BACKGROUND OF THE INVENTION

Electroless or autocatalytic as well as electrolytic plating of varied substrates find wide-spread utility in the preparation of such diverse articles as printed circuits, automotive trim, mirrors, electronic devices, etc.

In the normal commercial electroless plating process, the dielectric substrate, which has been etched preferably by physical or chemical means to improve metal adhesion, is sensitized by exposure to a solution of stannous ions, e.g., stannous chloride solution, and then activated by exposure to a solution of palladium ions, e.g., a palladium chloride solution. This activation is effected by reduction of the palladium ions to the zero valence state by the stannous ions to form palladium metal sites or by the formation of a tin/palladium complex on the surface of the dielectric substrate.

Thereafter, the activated substrate is plated by exposure to an electroless plating bath containing ions of the metal to be plated and a reducing agent capable of reducing (heterogeneously) the valence state of the plating ions present in bulk solution to the metallic state. In conventional processes, copper is plated using an electroless plating bath comprised of copper ions and formaldehyde as a reducing agent. In the plating of nickel or cobalt, the reducing agent commonly used is sodium hypophosphite.

More recently, process have been developed for electroless plating without the necessity of using palladium or other precious metal. For example in U.S. Pat. Nos. 3,772,056 and 3,772,078, non-metallic substrates are coated with a solution containing non-precious metal ions, i.e., ions of copper, nickel, cobalt or iron, and dried to form an adherent coating of the metal ions. Thereafter, the metal ions are reduced to the metallic state and the substrate is plated with a compatible electroless plating bath.

In U.S. Pat. No. 3,993,491 another procedure for effecting electroless plating of non-metallic substrates without the necessity of using palladium or any other precious metal ions is described. In the processes described therein, a non-metallic substrate is contacted with stannous and copper ions to form a stannous-cuprous complex on the surface of the substrate. The copper ions are then reduced to their metallic state using a suitable reducing agent.

Still another procedure is described in U.S. Pat. No. 3,993,799. In the process described therein, hydrous oxide colloids of metal or metal ions are coated on the surface of a non-metallic substrate. The substrate is then rinsed and immersed in a solution containing a reducing agent capable of reducing the metal ions to the metallic state (or reducing the outer surface).

While significant cost savings are realized by coating of the substrates with non-precious metal ions, as exemplified by the above disclosures, instead of with the more expensive palladium or other precious metal ions, care must be exercised in the selection of electroless plating baths used with such systems. Specifically, conventional hypophosphite baths are not effective in the plating of nickel or cobalt onto the surface of substrates prepared using non-precious metals, e.g., copper or silver, in a commercially suitable manner. Instead, it is necessary in the plating of nickel and cobalt to use an electroless plating bath containing a stronger reducing agent e.g., an amine-borane, such electroless plating baths being disclosed, for example, in U.S. Pat. No. 3,338,726, or a borohydride, as shown in U.S. Pat. Nos. 2,461,661 and 3,045,334. Such reducing agents, because of their relatively higher cost, diminish the commercial savings to be realized in the use of such procedures. Also, in using the preceding non-precious metal systems, at times a lower site density is realized thus reducing the speed and effectiveness of plating onto the prepared substrates.

Procedures permitting the utilization of non-precious metal activated substrates while eliminating or minimizing the aforesaid disadvantages and permitting the utilization of conventional, commercially available electroless plating baths would be highly desirable.

It is also well documented in the art that there are a wide variety of metals and alloys and semiconductor substrates which are non-catalytic (non-platable) for initiation of conventional electroless plating. Typical materials which are non-catalytic include copper, gold, silver, chromium containing stainless steels, kovar, moly, manganese, aluminum and its alloys, and others. In the prior art, exotic procedures have been adapted to provide such non-catalytic materials catalytic. Typical procedures well known are activation with palladium, zincating methods, impressing of a galvanic potential, and others. It is well documented that such procedures are tedious and costly and it would be highly desirable to eliminate them by a simple treatment which ideally would be universal to all non-catalytic materials (metals and alloys). In addition, various techniques have been developed for the activation of semiconductor substrates as to render them receptive to plating, e.g., activation via acidic compositions containing precious metal ions. Surprisingly, I found that the composition disclosed may effectively be used upon these non-catalytic (non-platable) materials or semiconductor substrates and thereby render the surface of such material platable in conventional electroless plating baths or even in electrolytic plating.

SUMMARY OF THE INVENTION

It is the principle object of the present invention to provide effective and economical processes for preparing non-catalytic surfaces, such as semiconductor substrates, receptive for electroless or electrolytic plating eliminating the need for palladium or other precious metals and permitting the utilization of conventional electrolytic or electroless plating baths.

Other objectives of the present invention, if not specifically set forth herein, will be apparent to one skilled in the art from a reading of the following detailed description of the present invention.

DETAILED DESCRIPTION OF THE INVENTION

The term "non-catalytic metal" as used in the present invention refers to a wide variety of materials (metals or alloys) including semiconductor substrates which are not catalytic and hence would not initiate conventional electroless nickel plating. Typical materials may include, however are not limited to, copper, gold, silver, chromium containing stainless steel, steel, kovar, moly, manganese, aluminum and its alloys, zinc, chromium, stainless steel, and others.

The process and systems of the present invention are applicable to the metallic plating of a wide variety of substrates (semiconductors, dielectrics and metallic).

The term "Semiconductor substrates" as used in the present invention refers to a wide variety of materials including silicon, germanium and III-V compounds well known in the semiconductor industry and the device arrays fabricated using such substrates.

It is noted that some of the objectives set forth in this invention are met in a recent patent, U.S. Pat. No. 3,993,801, which is included herein by reference.

The following steps are generally pursued when utilizing non-catalytic metals or semiconductor substrates.

(A) Immersing the substrate in a promoter solution containing primary metal ions e.g. nickel or cobalt, and a reducing agent capable of chemically interacting both with said substrate or metal or alloy and with said nickel or cobalt ions present in bulk solution to the metallic state; and (B) Immersing the treated substrate into an electroless or conventional electrolytic plating bath comprising of the metal ions to be plated. In the case of electrolytic deposition suitable metal ions must be present and a proper rectifier instead of the reducing agent (e.g., hypophosphite) commonly present in electroless baths.

It is believed that improved plating is achieved using the above developer (promoter) composition through the seeding of catalytic sites which are also conductive on the substrate due to plating of copper, nickel or cobalt from the developer solution onto the substrate. This seeding may result in varied concentrations of sites per unit area depending upon the parameters used in the immersion in the developer (e.g., time, temperature, and concentration).

Suitable reducing agents used in the promoter solutions of the present invention may be any chemical reducing agent capable of reducing the ions on the substrate (or chemically interacting with the metal or semiconductor element or compound on the surface) and also in the developer solution to the metallic state. In the chemical interaction, generally hydrogen gas is formed through the presence of a reactive intermediate adsorbed on the surface. While I do not wish to be bound by theory, the adsorbed intermediate may be chemisorbed nascent hydrogen or a hydride ion, both of which are short lived. Exemplary of such reducing agent are amine-boranes, borohydrides, hydrazine and its derivatives, N-alkyl-borazones, N-alkyl-borazoles, borazenes, borazines, and mixtures thereof. Particular reducing agents include dimethylamine borane, diethylamine borane, and the alkali metal and alkaline earth metal borohydrides, such as potassium and sodium borohydrides.

The following are a few publications describing the use of miscellaneous reducing agents (e.g., hydrazine) which have been reported capable of both copper and nickel plating.

P. Fintschenko et al, Metal Finishing, January (1970).

D. J. Levy, Proc. Electroplaters Soc., 50, p. 29 (1963).

D. J. Levy, Electrochem. Tech., 1, No. 1-2, pl 38 (1963).

J. W. Dini et al, Plating, 54, p. 385 (1967).

It is further recognized that with the availability of new chemicals, other chemical reducing agents will be available capable of functioning in accordance to the present invention, and hence the inclusion of other such reducing agents falls within the spirit of this invention.

In the practice of the present invention I have thus recognized that sufficient reducing agent should be present in the developer (promoter) solution to insure the sequential reaction with the surface of the substrate and thereafter heterogeneous reduction of the ions in the developer solution. Thus for increased probability, a molar ratio of reducing agent to metal ions in the developer solution should exceed 1:1, and preferably should be at least 2:1. Ratios greater than about 15:1, while workable, are of little practical value and serve to increase the cost of the process. The molar concentration of the reducing agent will normally be within the range of from about 0.015 M to about 0.2 M; and the molar concentration of the metal ions will normally be within the range of from about 0.003 M to about 0.1 M. Surprisingly, it is noted that the concentration of reducing agents used in electroless plating baths (boron type), as referred to in the prior art, all normally range from about 0.015 M to about 0.2 M, while the metal ion concentration will range from about 0.02 M to about 0.5 M. The molar ratio of reducing agent to metal ions thus is less than 1:1, and normally between 0.75 M and 0.4 M. Such baths are taught, for example, in U.S. Pat. No. 3,338,726 as typical compositional make-ups which are effective for electroless metal build-up.

While the present invention contemplates the usage of primary metal ions selected from the group consisting of copper, cobalt, nickel, and iron, other metal ions may also be present, singly or in combination. These other metal ions (secondary) when reduced would also provide catalytic sites or sites capable of conducting galvanic current required in electrolytic plating. Such ions may be precious metal type, e.g., palladium, gold, silver, platinum and the like. Their adaptation is carried forth in a similar fashion as the primary metal ions with respect to the reducing agent present in the same composition.

Conventional electroless plating baths suitably used in plating in accordance with the present invention are comprised of ions of the metal to be plated, a complexing agent, and a reducing agent. In nickel or cobalt baths, the reducing agent commonly employed is a hypophosphite reducing agent, such as sodium hypophosphite. In copper baths (the reducing agent commonly employed being formaldehyde) or in other electroless (chemical) plating baths, the reducing agent may not be compatible with the non-catalytic (non-platable) substrates.

Conventional electrolytic plating baths are also well known for precious and non-precious metals in the art.

The following examples are presented as illustrative of the present invention and not in limitation thereof. In the examples where nickel ions are used in the developer or plating solutions, it will be apparent to one skilled in the art that cobalt ions, because of their similar properties, may be substituted.

EXAMPLE I

In this example as well as the following examples, the following procedure was employed:

1. Immerse ABS substrates, previously etched with a $CrO_3/H_2SO_4$ solution, into the described primer solution for several minutes;
2. Rinse;

3. Immerse primed substrate into the described developer solution;
4. Rinse (optional); and
5. Immerse developed substrate into described electroless plating bath.

In the present example, a primer solution having the following composition was used at room temperature:
$SnCl_2.2H_2O$: 81 g/l
CuCl: 6 g/l
HCl (conc.): 45 cc/l
Phenol: 40 g/l Following immersion in the above primer solution, the primed substrates were rinsed and immersed in the following promoter composition:
Dimethylamine borane (DMAB): 3 g/l
$NiSO_4.6H_2O$: 2.5 g/l
Citric acid.$H_2O$: 3.6 g/l
$NH_4OH$ to pH: 8.8
Temperature: 36° C.

It was observed that within 2-3 minutes the surface becomes brown in color, and within 3-5 minutes a complete intensification took place as shown by a grey color.

Nickel plating was achieved by immersion of the developed substrate in the following electroless nickel-hypophosphite bath:
Bath 1
$NiSO_4.6H_2O$: 12.5 g/l
Citric acid.$H_2O$: 18 g/l
$NH_4OH$ to pH: 8.9
$NaH_2PO_2.H_2O$: 18 g/l
Temperature: 25° C.

As aforementioned, improved copper plating can also be achieved using the present improved developer solutions due to intensified site development. Thus, uniform plating of copper was achieved by immersion of a substrate developed in the foregoing manner into a conventional electroless copper-formaldehyde bath having the following composition:
Bath 2
$CuSO_4.5H_2O$: 10 g/l
$KNaC_3H_4O_6.4H_2O$ (potassium sodium tartrate): 16 g/l
NaOH: 16 g/l
$H_2CO$ (37%): 8 g/l

EXAMPLE II

Electroless plating of nickel and copper obtained using the procedure, primer solution and electroless plating baths of Example I with the following developer solution:
DMAB: 3 g/l
$CoSO_4.7H_2O$: 1.25 g/l
Sodium citrate.$2H_2O$: 2.5 g/l
$NH_4OH$ to pH: 8.8
Temperature: 36° C.

EXAMPLE III

Electroless plating of nickel and copper was obtained using the procedure, primer solution and electroless plating baths of Example I with the following developer solution:
DMAB: 3 g/l
$CoSO_4.7H_2O$: 1.25 g/l
Sodium citrate.$2H_2O$: 2.5 g/l
$CuSO_4.5H_2O$: 0.072 g/l
$NH_4OH$ to pH: 8.8
Temperature: 36° C.

It should be noted that this composition is more reactive in comparison to the composition of Example II and thus lowering of the reactivity is recommended. Moreover, it should be obvious to those skilled in the art of plating that the catalytic surface resulting at the conclusion of the development stage consists of both cobalt and copper.

EXAMPLE IV

Electroless plating of nickel and copper was obtained using the procedure, primer solution and electroless plating baths of Example I with the following developer solution:
DMAB: 3 g/l
Nickel sulfamate: 0.8 g/l (Ni)
$NH_4OH$ to pH: 8
Temperature: 38° C.

Good intensified development took place within 5 minutes. Additional Tergitol (TMN) surfactant seemed to improve the overall uniformity.

EXAMPLE V

In this example, priming of the ABS substrate was achieved using as the primed solution a hydrous oxide colloid of copper prepared by adding 400 ml of 0.025 molar $NH_4OH$ dropwise with stirring to 1600 ml of 0.0125 molar copper acetate.

ABS substrates primed with the above colloidal composition were developed using the following developer solution:
DMAB: 4 g/l
Nickel sulfamate: 1.6 g/l (Ni)
NaOH to pH: 6.2
Temperature: 44° C.

Using the electroless nickel bath of Example I, a complete intensified developed surface was obtained within 5 minutes of immersion, and good initiation in the electroless bath was noted. It should be noted that using a modified developer formulation similar to Example No. 1 was poor, probably due to the presence of ammonia. Based upon this example and procedure, it should be obvious that hydrous oxide colloids of cobalt and nickel may be used as well as combinations thereof.

EXAMPLE VI

DMAB: 1.5 g/l
$NiSO_4.6H_2O$: 1.25 g/l
Citric acid.$H_2O$: 1.8 g/l
$NH_4OH$ to pH: 7.8
Temperature: 37° C.

When substituting the above solution after a partial degassing for the developer solution of Example V, it was noted that development took place within 2 minutes while complete intensification took place in about 8 minutes. In this example, no agitation or surfactant was included. The intensified developed substrate was directly immersed into the electroless nickel bath of Example I with good immediate initiation noted. Dilution (x2) of the above modified developer formulation under the same conditions did result in intensified development, however with a lower speed.

EXAMPLE VII

Electroless plating of nickel was obtained using the procedure, primer solution and electroless nickel plating bath of Example I with the following developer solution:
$NiCl_2.6H_2O$: 3 g/l Ethylene diamine: 5 g/l
Potassium borohydride: 1 g/l
pH: 9.9
Temperature: 38° C.

Standard development was noted within two to three minutes of immersion, while complete intensification was observed only after about twelve minutes of immersion. The latter could be foreshortened by further adjusting developer reactivity and probably by lowering or eliminating the ethylenediamine concentration. Following the intensified development good initiation in the electroless bath No. 1 took place. To overcome some of the stability problems associated with borohydrides, the use of salts of cyano-borohydrides is recommended. The latter show good stability over a wide pH range.

EXAMPLE VIII

As stated previously, one of the novel features of this invention is the fact that development and intensification take place in the same media in a preferred sequence of events. This feature is accomplished to a large extent by the relative concentration make-up of the developer solution. To better illustrate this point the following results are provided.

metals which are more noble with respect to nickel, the inclusion of a complexing agent and/or a chelating agent is preferred. Specifically, the complexing agent and/or chelating agent should be of the type which could complex or chelate the more noble metal with respect to nickel. Such materials are well known in the art and include an endless list of chemicals, and they are recited in many publications, e.g., K. B. Yatsimirski et al, "Instability Constants of Complex Compounds," Pergamon Press (1960). I have also recognized that in addition to the metal ions (primary or secondary) other metallic constituents may be present for the purpose of providing inhibition in the growth of the catalytic (metallic) sites onto the non-platable substrates. It is generally preferable to have a catalytic site of small particle size distribution. The metallic constituents are generally selected from the group consisting of copper, zinc, cadmium, tin, thalium, mercury, lead, and titanium. The concentration for the components is preferably less than the molar concentration for the reducing agent(s) and the optimum concentration can generally be determined by simple trial experiments well known in the art, taking into consideration the make-up of the promoter composition and its activity.

| | | Observed timing (minutes) to: | |
|---|---|---|---|
| No. | $DMAB^{(a)}/NiSO_4.6H_2O$(g/g) in modified solution | Development (brown color formation) | Intensified Development (grey color formation) |
| 1 | 3/12.5 | (b) | none after 7 min. |
| 2 | 3/6.25 | (b) | 40% only after 7 min. |
| 3 | 3/3.12 | 2½ | 4 |
| 4 | 3/1.6 | 2½ | 4 |

$^{(a)}$All developer solutions were operated at 39° C. and were also composed of citric acid $H_2O$ at × 1.44 the weight of nickel sulfate.hexahydrate. Ammonium hydroxide was used to maintain a pH of 8.7.
$^{(b)}$The observation of a brown color was non-reproducible and in cases in which a brown color was formed, the intensified development was sluggish.

EXAMPLE IX

A ceramic substrate coated with silver was used; the silver was derived from a printable ink composition. After activation in a 20% hydrochloric acid, the substrate was effectively treated in the developer of example I and then in electroless nickel-phosphorus formulation. It is recognized that in using surface primed with silver, it is advantageous to include within the developer composition a silver complexing agent. Such inclusion will extend the life of the developer composition, hence making the process more economical.

I have also found that due to the non-noble (precious) characteristic of silver it may be required to treat the silver surface prior to the developer composition as to dissolve any oxide layer.

EXAMPLE X

Cleaned non-catalytic materials such as moly, chromium, copper, chromium containing steel, an alloy of aluminum (7075 T6, 6061 T6), were contacted for 1 to 2 minutes in a composition of example I at temperature range 60° to 70° C. After this treatment, the materials were immersed in a conventional electroless nickel using hypophosphite as the reducing agent. It was noted that instantaneous plating was started. The plated parts surprisingly have also shown good adhesion before and after heat treatment.

I have also recognized that in the processing of non-catalytic metals or alloys and in particular those having

EXAMPLE XI

Cleaned silicon wafers: [111] N-type, [100] P-type, and [111] P-type were cleaned and treated as follows:
1. Immersion into the composition (promoter) of Example I for about 1-minute while the composition was maintained between 90° to 99° C.;
2. Water rinse; and
3. Immersion into an electroless nickel composition comprising hypophosphite as the reducing agent operating at 85° C. for about 1-minute.

In all cases, effective nickel plating was noted after the activation in the promoter composition. In fact, plating was noted on both sides of the wafers; one side was polished and the second side was chemically etched. This procedure is especially significant in the metallization of semiconductor substrate since it eliminates the conventional step whereby activation is effected via immersion into hydroflouric acid solutions containing precious metal ions (e.g., palladium gold, and the like). The conventional approach, while it works, often results in problem for those devices having shallow junctions or poor adhesion onto the silicon due to the precious metal-silicon interface. By contrast, in the present approach only a nickel-silicon interface exists and the use of hydroflouric acid is completely eliminated. Accordingly, it is recognized that the present procedure is also useful for metallization of semiconductor substrates such as silicon and doped silicon as well as other semiconductor substrates such as germanium or III-V compounds (e.g., Ga-As) and the like. It is also noted that though step 3 (above) was electroless metal deposition, the seeding of the surface taken in step 1 is sufficient to permit electrolytic plating. Hence, in its broadest sense, the present method in which the promoter composition is employed may be considered as a method for rendering non-platable substrates platable by both electroless or electrolytic type deposition techniques.

It is further noted that though in this example the semiconductor substrates were different crystallographic forms of silicon, the present invention does further apply to other substrates, e.g., germanium and III-V compounds. Such adaptation falls within the spirit of this invention.

I have also recognized that, at times, for improved adhesion or for the purpose of forming an ohmic contact, a heat treatment step may be desirable, particularly after the promoter activation step.

What I claim is:

1. A process for rendering a non-platable substrate platable by conventional electroless plating, said process resulting in the deposition of metallic sites, said sites being catalytic to said conventional electroless plating, said substrate selected from the group consisting of silicon, germanium, and III-V compounds, comprising the step of immersing said non-platable substrate into a promoter composition wherein said promoter composition is a single composition which comprises a suitable reducing agent and primary metal ions selected from the group consisting of nickel, cobalt, and iron wherein said reducing agent is capable of chemically reacting with said non-platable substrate and said primary metal ions and further wherein the concentration of said reducing agent relative to said primary metal ions is so adjusted as to permit the initial chemical interaction of the reducing agent with the non-platable substrate and then the heterogeneous reduction of some of the primary metal ions present in the promoter composition, and further wherein said promoter composition also comprises other metal ions selected from the group consisting of tin, cadmium, zinc, thallium, and lead and mixtures thereof, said other metal ions being present in a lower concentration relative to said reducing agent and in a sufficient concentration to inhibit the growth of said metallic sites and further wherein said process is prior to conventional electroless plating.

2. The process according to claim 1 wherein the concentration of said reducing agent is in molar excess to said primary metal ions.

3. The process according to claim 1 wherein said primary metal ions are nickel.

4. The process according to claim 1 wherein said promoter composition is used above room temperature.

5. The process according to claim 1 wherein said reducing agent is dimethylamine borane and/or its derivatives.

6. The process according to claim 1 wherein said reducing agent is a borohydride and/or its derivatives.

7. The process according to claim 1 wherein said reducing agent is hydrazine and/or its derivatives.

8. The process according to claim 1, wherein said promoter composition further contains secondary metal ions capable of reacting with said reducing agent selected from the group consisting of palladium, gold, silver, and platinum and mixtures thereof said secondary metal ions being in a concentration such as to permit their reaction with the reducing agent in a fashion similar to that of the primary metal ions.

9. The process according to claim 1 wherein said non-platable substrate is silicon.

* * * * *